(12) United States Patent
Stevenson

(10) Patent No.: US 7,639,094 B1
(45) Date of Patent: Dec. 29, 2009

(54) SHARED PIN RESONATOR OSCILLATORS

(75) Inventor: Paul Stevenson, Colorado Springs, CO (US)

(73) Assignee: Marvell International Ltd., Hamilton (BM)

( * ) Notice: Subject to any disclaimer, the term of this patent is extended or adjusted under 35 U.S.C. 154(b) by 67 days.

(21) Appl. No.: 12/118,574

(22) Filed: May 9, 2008

Related U.S. Application Data

(60) Provisional application No. 60/916,933, filed on May 9, 2007.

(51) Int. Cl.
  *H03B 5/12* (2006.01)
(52) U.S. Cl. ............... 331/108 C; 331/162; 331/116 M
(58) Field of Classification Search ............. 331/108 C, 331/162
  See application file for complete search history.

(56) References Cited

U.S. PATENT DOCUMENTS

| | | | | |
|---|---|---|---|---|
| 4,107,625 A | * | 8/1978 | Courier de Mere | ........... 331/37 |
| 4,575,690 A | * | 3/1986 | Walls et al. | .................. 331/162 |
| 5,481,227 A | * | 1/1996 | Komori et al. | .................. 331/2 |
| 5,748,049 A | * | 5/1998 | Bayruns et al. | ............... 331/49 |
| 2002/0171511 A1 | * | 11/2002 | Oita | ........................... 333/193 |

* cited by examiner

*Primary Examiner*—Joseph Chang

(57) ABSTRACT

An oscillator circuit for a plurality of resonator-based oscillators is provided. In a dual oscillator circuit, a first oscillator circuit operating at a first frequency is coupled to a second oscillator circuit operating at a lower frequency. The two circuits are separated by a low-pass filter that isolates the input stage of the first oscillator circuit from the input stage of the second oscillator circuit. A circuit leg shared between the first oscillator circuit and the second oscillator circuit is configured to couple the first input stage of the first oscillator circuit to a first external resonator resonate at the first frequency and couple the second input stage of the second oscillator circuit to a second external resonator resonate at the second frequency.

15 Claims, 9 Drawing Sheets

SHARED PIN RESONATOR OSCILLATORS

CROSS-REFERENCE TO RELATED APPLICATION

This application claims the benefit of U.S. Provisional Patent Application No. 60/916,933 filed May 9, 2007, the contents of which are hereby incorporated by reference as if fully stated herein.

FIELD OF THE INVENTION

This invention pertains generally to integrated circuit chips, and more particularly to integrated circuit chips including more than one resonator oscillator circuit.

BACKGROUND OF THE INVENTION

Oscillators using resonators, such as crystals, are typically used to provide precise, stable time references. Sometimes an integrated circuit chip, device or appliance, may require more than one oscillator, such as when multiple operating modes benefit from different clock frequencies. For example, in battery operated appliances, such as cell phones, it is advantageous to shut off a high frequency (13 MHz for example) crystal oscillator when the high frequency crystal oscillator is not needed, and maintain a low power 32 kHz oscillator running to keep time and permit the system come out of a sleep state.

FIG. 1 is a schematic of a conventional Pierce oscillator circuit used to implement a single crystal-based oscillator circuit on an integrated circuit chip. The oscillator circuit 100 on integrated circuit chip 102 includes resistor 104, inverter 105, and capacitor 106 integrated on the integrated circuit chip. Capacitors 108 and 110 can also be integrated on the integrated circuit chip, but do not have to be, as the location of the capacitors 108 and 110 makes no difference to circuit behavior. Crystal 112 is an external component that is soldered, or otherwise attached to the rest of the circuit. Crystal 112 is typically made of quartz, or some other piezoelectric material. The Pierce circuit architecture requires two bond pads, 114 and 116 in order to attach crystal 112 to the Pierce circuit. Such a Pierce circuit is very easy to design, test, and manufacture.

Resistor 104 is typically of a high value, usually a million Ohms or more, and is used to force inverter 105 to a high gain point. This lets inverter 105 behave as an amplification device, and not as a traditional inverter. Capacitor 106 is tied to the high impedance node of inverter 105 and prevents any leakage current in the circuit from disturbing the DC bias point of inverter 105, and hence the amplification of inverter 105. Capacitors 108 and 110, along with parasitic resistance in the circuit, provide phase shift around the circuit loop 113 to ensure oscillation of crystal 112 will grow.

FIG. 2 is a schematic diagram of dual Pierce oscillator circuits used to implement crystal-based oscillator circuits on an integrated circuit chip. As shown, a first Pierce oscillator circuit 200 and a second Pierce oscillator circuit 202 are implemented separately on a single integrated circuit chip 204. As the two circuits are implemented separately, each has its own set of pads, such as pads 206 and 208 for Pierce oscillator circuit 200 and pads 210 and 212 for Pierce oscillator circuit 202. This requires four pads to make all the necessary connections to crystals 214 and 216. In the case of FIG. 2, crystal 214 might be resonant at 32768 Hz (32 kHz), and crystal 216 might be resonant at 13 MHz.

SUMMARY OF THE INVENTION

A circuit for a plurality of resonator-based oscillators is provided. The circuit includes a first oscillator circuit configured to operate at a first frequency, the first oscillator circuit including an input stage having a high-pass filter and a first circuit leg configured to couple an output stage of the first oscillator circuit to a first external resonator resonant at the first frequency, a second oscillator circuit configured to operate at a second frequency lower than the first frequency, the second oscillator circuit including an input stage having a low-pass filter and a second circuit leg configured to couple an output stage of the second oscillator circuit to a second external resonator resonant at the second frequency, and a third circuit leg shared between the first oscillator circuit and the second oscillator circuit, the third circuit leg configured to couple a first input stage of the first oscillator circuit to the first external resonator and couple the second input stage of the second oscillator circuit to the second external resonator.

In another aspect of the invention, the external resonators may be either MEMS resonators or crystals.

In another aspect of the invention, the circuit is implemented in an integrated circuit chip and the third circuit leg is coupled to a pin of the integrated circuit chip with the pin shared by the first oscillator circuit and the second oscillator circuit.

In another aspect of the invention, the first frequency is approximately 10 times the second frequency.

In another aspect of the invention, the circuit further includes a plurality of oscillator circuits, each oscillator circuit configured to operate at a respective one of a plurality of unique frequencies with each unique frequency being lower than the first frequency and higher than the second frequency, each of the plurality of oscillator circuits including a respective input stage having a band-pass filter operable at a respective one of the plurality of unique frequencies, and a respective circuit leg configured to couple a respective output stage of the each oscillator circuit to a respective one of a plurality of external resonators resonant at a respective one of the unique frequencies wherein the third circuit leg couples the respective input stage of the each of the plurality of oscillator circuits to respective one of the plurality of external resonators.

DETAILED DESCRIPTION OF THE PREFERRED EMBODIMENT

From the foregoing description of the dual Pierce oscillator circuits implemented on a single integrated circuit, it can be understood that each Pierce oscillator circuit conventionally requires two dedicated pads or pins for connecting external components needed to complete the circuit. However, in an integrated circuit, pads for the connection of external components are precious. Therefore, an architecture for multiple Pierce oscillator circuits that can eliminate one or more of the required pads is highly desirable.

Figure 1:
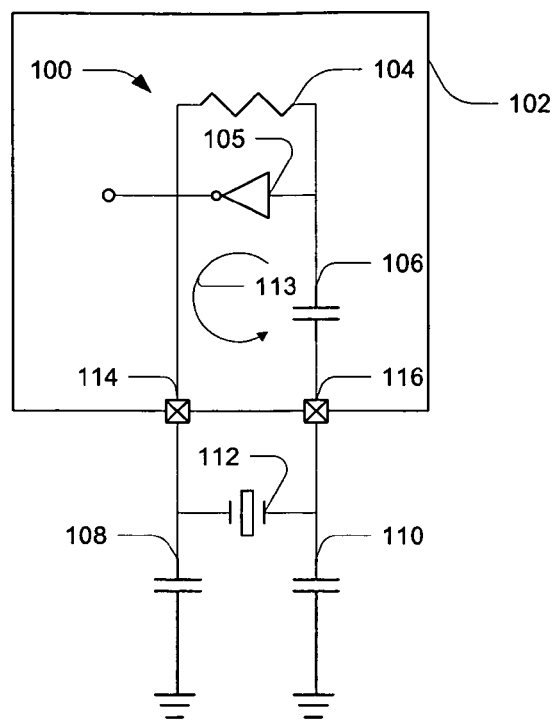
FIG. 1 is a schematic of a conventional Pierce oscillator circuit used to implement a single crystal-based oscillator circuit on an integrated circuit chip.
Figure 2:
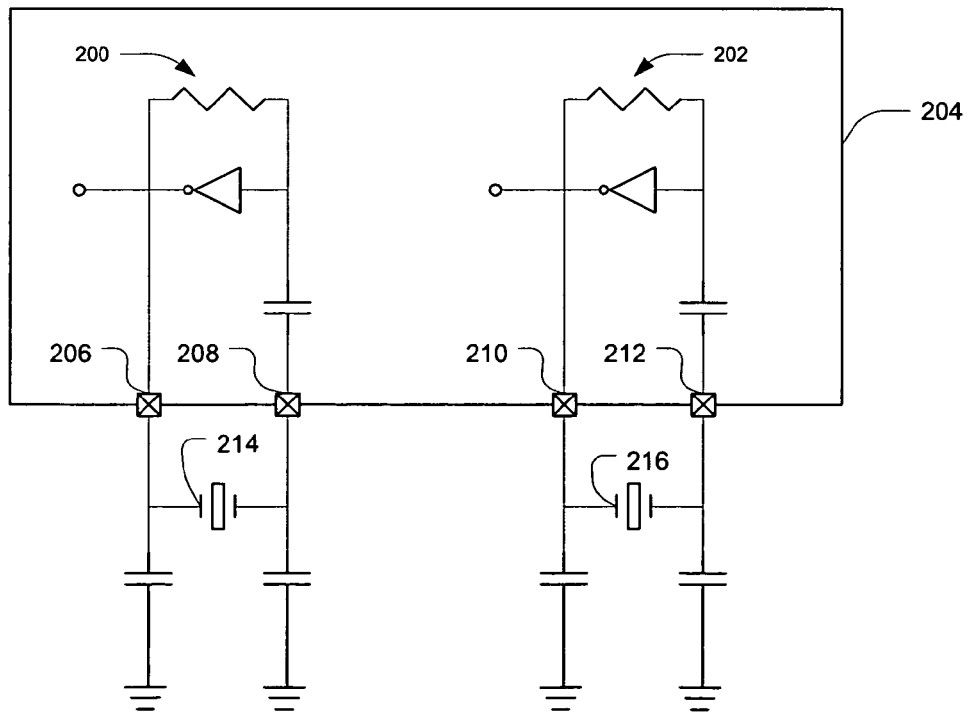
FIG. 2 is a schematic diagram of dual Pierce oscillator circuits used to implement crystal-based oscillator circuits on an integrated circuit chip.
Figure 3:
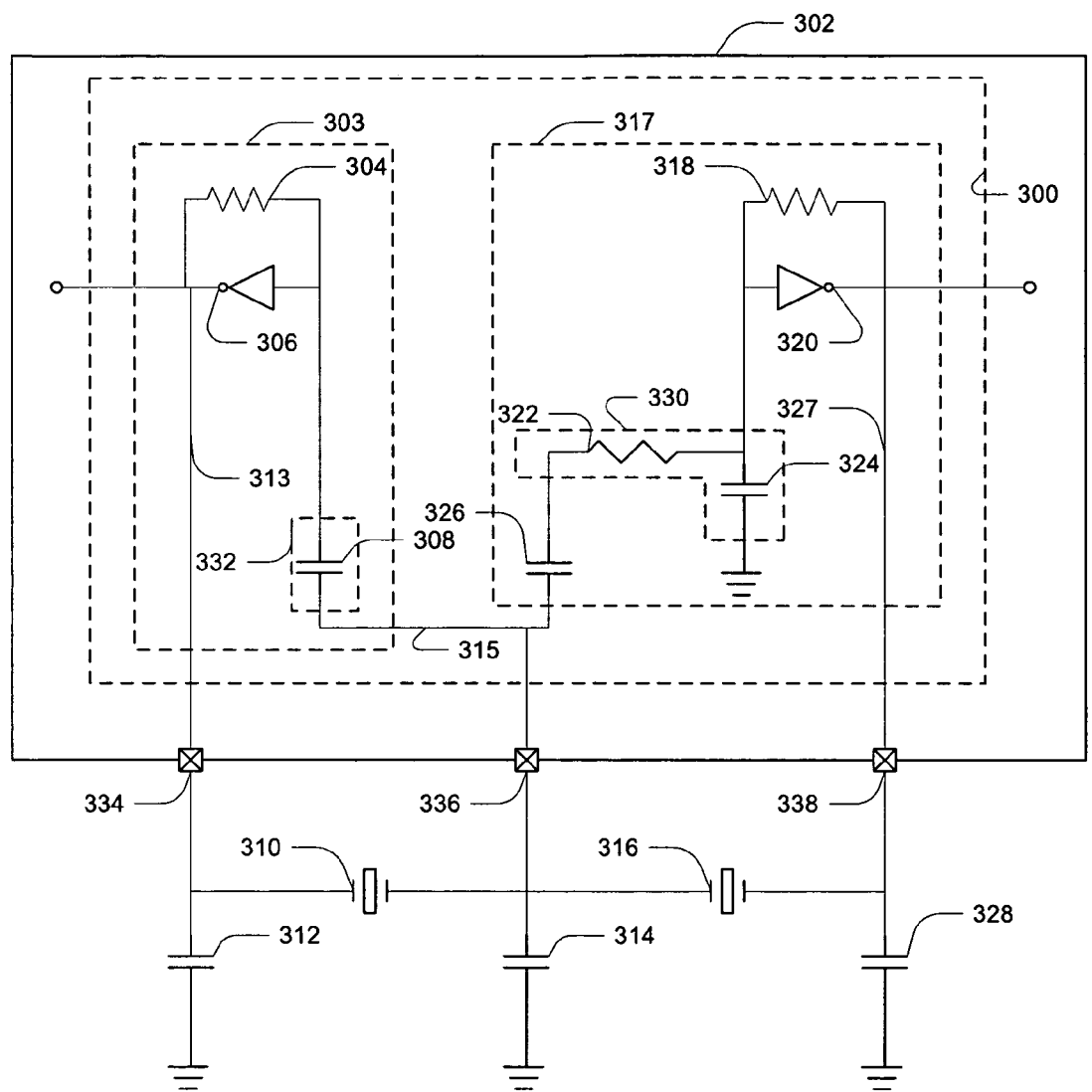
FIG. 3 is a schematic diagram of a dual Pierce oscillator circuit on an integrated circuit chip having a shared pin in accordance with an exemplary embodiment of the present invention.

FIG. 3 is a schematic diagram of a dual Pierce oscillator circuit on an integrated circuit chip having a shared pin in accordance with an exemplary embodiment of the present invention. The dual Pierce oscillator circuit 300 implemented on integrated circuit chip 302 eliminates one of the pads conventionally used to implement two Pierce oscillators on one integrated circuit chip. In FIG. 3, a first Pierce oscillator circuit 303 is formed by resistor 304, inverter 306 and capacitor 308. The output stage of Pierce oscillator circuit 303 is connected to an external resonator, such as crystal 310, and capacitor 312 by circuit leg 313. The input stage of Pierce oscillator circuit 303 is connected to the same external resonator, such as crystal 310, and capacitor 314 by circuit leg 315. In addition, while not part of the first Pierce oscillator circuit 303, an additional resonator, such as crystal 316, is connected to Pierce oscillator circuit 303 of circuit leg 315. In one implementation, Pierce oscillator circuit 303 is used for creating a high frequency oscillator, e.g., intended to operate in the megahertz range.

A second Pierce oscillator circuit 317 is formed from resistor 318, inverter 320, resistor 322, capacitor 324 and capacitor 326. An output stage of Pierce oscillator circuit 317 is connected by circuit leg 327 to an external resonator, such as crystal 316, and capacitor 328. An input stage of Pierce oscillator circuit 317 is connected by circuit leg 315 to the same resonator, such as crystal 316, and capacitor 314. Crystal 310 is also attached to, but does not play a role in the operation of, Pierce oscillator circuit 317. In one implementation, Pierce oscillator circuit 317 is used as a low frequency oscillator, e.g., intended to oscillate in the kilohertz range.

It should be noted that capacitors 312, 314 and 328 can be integrated into the integrated circuit chip 302 and do not have to be external.

Resistor 322 and capacitor 324 form a low pass filter 330 in the input stage of Pierce oscillator circuit 317 preventing high frequency energy from the high frequency Pierce oscillator circuit 303 from reaching inverter 320 of Pierce oscillator circuit 317. Capacitor 308 with parasitic resistance in the circuit forms a high pass filter 332 in the input stage of Pierce oscillator circuit 303 thus limiting low frequency oscillator energy of Pierce oscillator circuit 317 from reaching inverter 306.

As can be appreciated from the foregoing discussion, only three pads or pins need to be provided on integrated circuit chip 302 for connecting external components to dual Pierce oscillator circuit 300. Namely, pad or pin 334 for circuit leg 313, pad or pin 336 for circuit leg 315 and pad or pin 338 for circuit leg 327. Thus the invention eliminates a pin when two crystal oscillators of different frequencies are to be integrated onto a single integrated circuit chip.

Figure 4A:
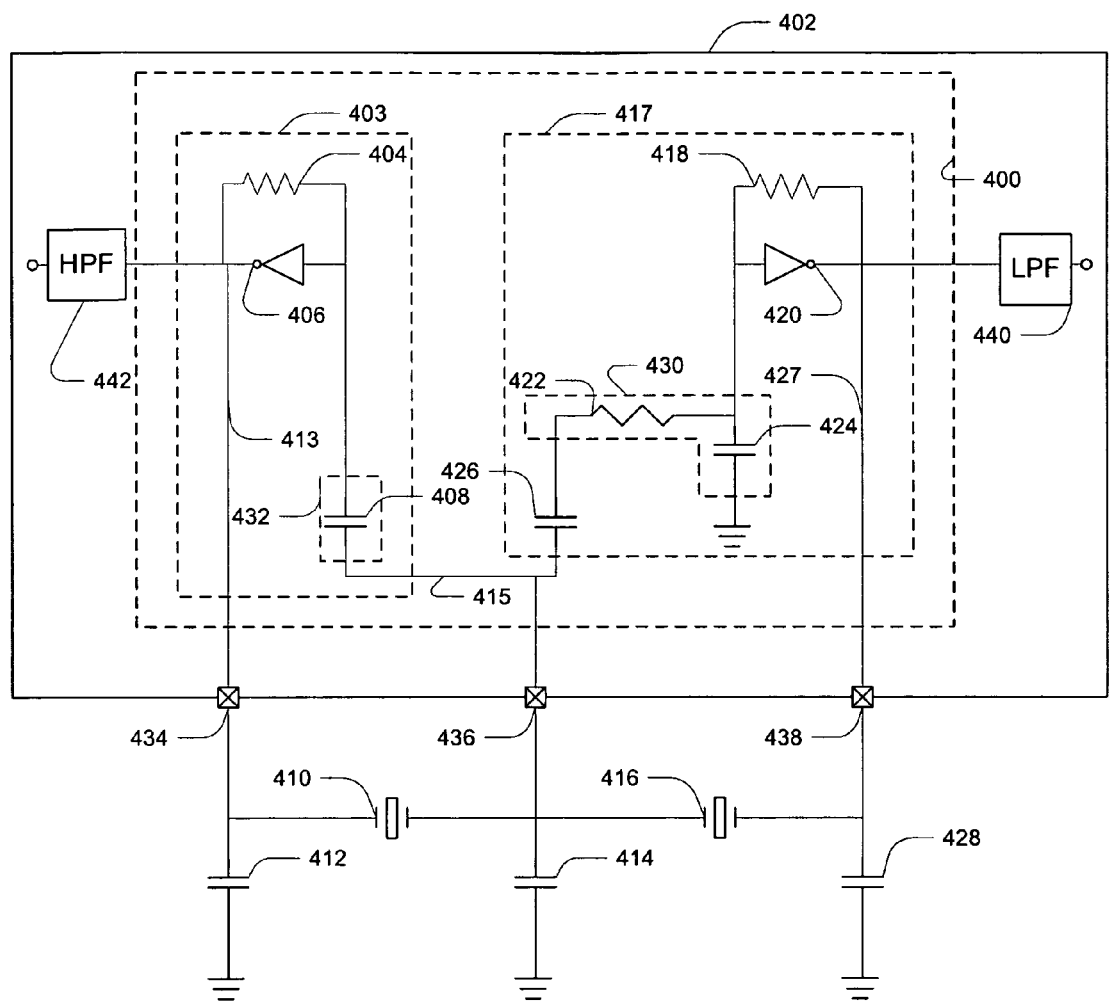
FIG. 4a is a schematic diagram of a dual Pierce oscillator on an integrated circuit chip having a shared pin and additional filtering in accordance with another exemplary embodiment of the present invention.

FIG. 4a is a schematic diagram of a dual Pierce oscillator on an integrated circuit chip having a shared pin and additional filtering in accordance with an exemplary embodiment of the present invention. The dual Pierce oscillator circuit 400 is implemented on integrated circuit chip 402. A first Pierce oscillator circuit 403 is formed by resistor 404, inverter 406 and capacitor 408. The output stage of Pierce oscillator circuit 403 is connected to an external resonator, such as crystal 410, and capacitor 412 by circuit leg 413. The input stage of Pierce oscillator circuit 403 is connected to the same resonator, namely crystal 410, and capacitor 414 by circuit leg 415. In addition, crystal 416 is connected to Pierce oscillator circuit 403 even though crystal 416 does not play a role in the operation of Pierce oscillator circuit 403. In one implementation, Pierce oscillator circuit 403 is used for creating a high frequency oscillator, e.g., intended to operate in the megahertz range.

A second Pierce oscillator circuit 417 is formed from resistor 418, inverter 420, resistor 422, capacitor 424 and capacitor 426. An output stage of Pierce oscillator circuit 417 is connected by circuit leg 427 to an external resonator, such as crystal 416, and capacitor 428. An input stage of Pierce oscillator circuit 417 is connected by circuit leg 415 to crystal 416 and capacitor 414. Crystal 410 is also attached but does not play a role in the operation of Pierce oscillator circuit 417. In one implementation, Pierce oscillator circuit 417 is used as a low frequency oscillator, e.g., intended to oscillate in the kilohertz range.

It should be noted that capacitors 412, 414 and 428 can be integrated into the integrated circuit chip 402 and do not have to be external.

Resistor 422 and capacitor 424 form a low pass filter 430 in the input stage of Pierce oscillator circuit 417 preventing high frequency energy from the high frequency Pierce oscillator circuit 403 from reaching inverter 420 of Pierce oscillator circuit 417. Capacitor 408 with parasitic resistance in the circuit forms a high pass filter 432 in the input stage of Pierce oscillator circuit 403 thus limiting low frequency oscillator energy of Pierce oscillator circuit 417 from reaching inverter 406.

To further ensure a clean signal to the appropriate signal paths, a low pass filter 440 takes the output of inverter 420 and rejects any remaining high frequency oscillation and amplifies the low frequency into a useable Low Frequency Clock. Likewise a high pass filter 442 rejects any remaining low frequency energy on the output of inverter 406 and amplifies the high frequency energy into a useable High Frequency Clock.

Figure 4B:
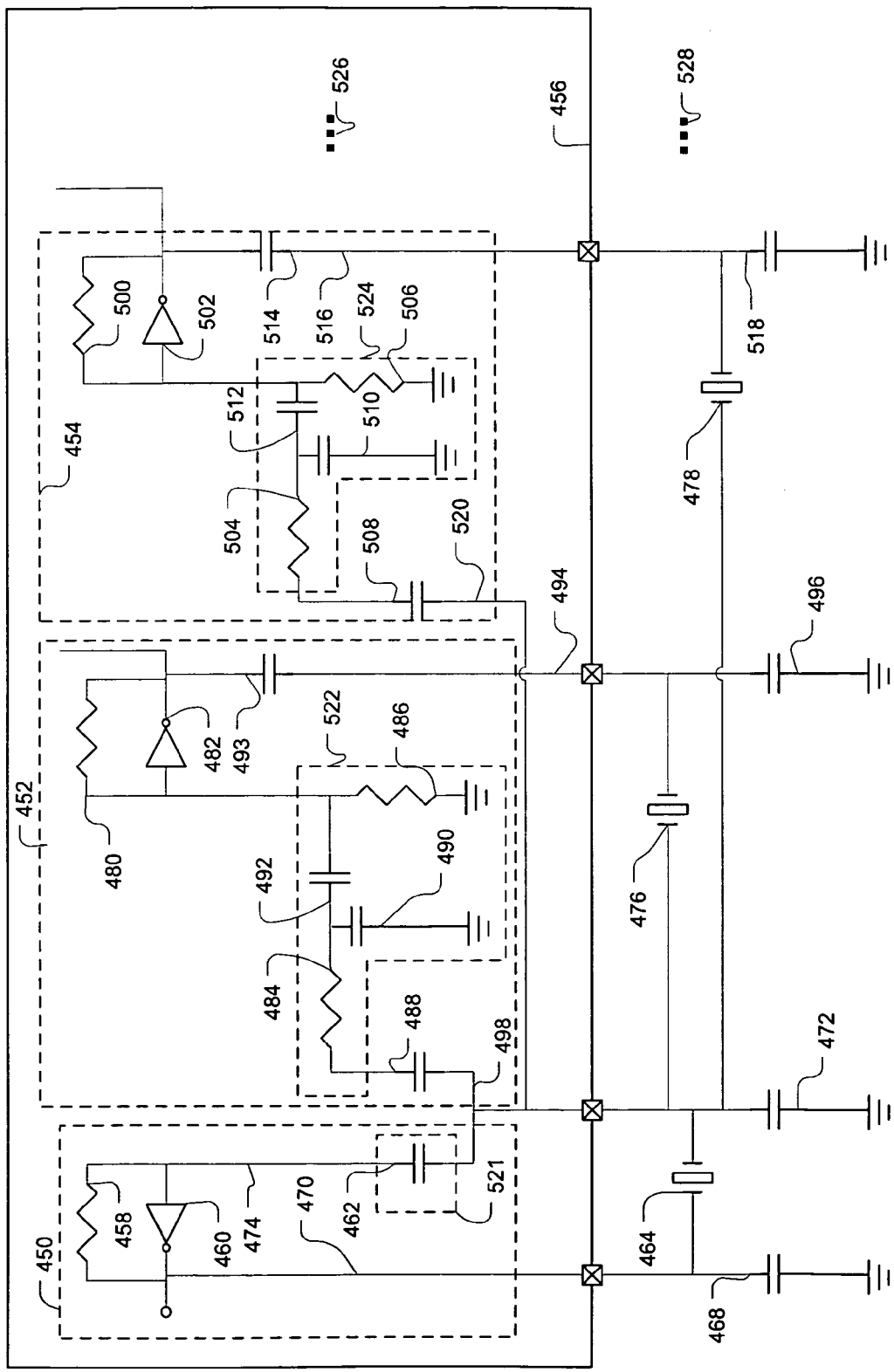
FIG. 4b is a schematic diagram of three or more Pierce oscillators on an integrated circuit chip having shared pins in accordance with another exemplary embodiment of the present invention.

FIG. 4b is a schematic diagram of three or more Pierce oscillators on an integrated circuit chip having shared pins in accordance with another exemplary embodiment of the present invention. In FIG. 4b, a plurality of Pierce oscillators are implemented using inverters, capacitors and crystals where the high impedance (input) node of all the inverters (amplifiers) share a common pin. All crystals also share the common pin. The low impedance (output) node of the amplifiers attach independently, segregated from one another, to the respective other terminal of the crystals.

In the following example, three Pierce oscillators are shown; however, it is to be understood that the number of Pierce oscillators is not fixed and can be any number. The three Pierce oscillators circuits 450, 452 and 454, are implemented on integrated circuit chip 456. Pierce oscillator circuit 450 is formed by resistor 458, inverter 460 and capacitor 462. The output stage of Pierce oscillator circuit 450 is connected to an external resonator, such as crystal 464, and capacitor 468 by circuit leg 470. The input stage of Pierce oscillator circuit 450 is connected to the same resonator, namely crystal 464, and capacitor 472 by circuit leg 474. In addition, crystals 476 and 478 are connected to Pierce oscillator circuit 450 even though crystals 476 and 478 do not play a role in the operation of Pierce oscillator circuit 450.

A second Pierce oscillator circuit 452 is formed from resistor 480, inverter 482, resistors 484 and 486 and capacitors 488, 490, 492 and 493. An output stage of Pierce oscillator circuit 452 is connected by circuit leg 494 to an external resonator, such as crystal 476, and capacitor 496. An input stage of Pierce oscillator circuit 452 is connected by circuit leg 498 to crystal 476 and capacitor 472. Crystals 464 and 478 are also attached but do not play a role in the operation of Pierce oscillator circuit 452.

A third Pierce oscillator circuit 454 is formed from resistor 500, inverter 502, resistors 504 and 506 and capacitors 508, 510, 512 and 514. An output stage of Pierce oscillator circuit 454 is connected by circuit leg 516 to an external resonator, such as crystal 478, and capacitor 518. An input stage of Pierce oscillator circuit 454 is connected by circuit leg 520 to crystal 478 and capacitor 472. Crystals 464 and 476 are also attached but do not play a role in the operation of Pierce oscillator circuit 454.

In operation, capacitor 462 with parasitic resistance in the circuit forms a high pass filter 521 in the input stage of Pierce oscillator circuit 450 thus limiting low frequency oscillator energy of Pierce oscillator circuit 452 from reaching inverter 460.

Resistors 484 and 486 and capacitors 490 and 492 form a band pass filter 522 in the input stage of Pierce oscillator circuit 452 preventing high frequency energy from the high frequency Pierce oscillator circuit 450 from reaching inverter 482 of Pierce oscillator circuit 452. In a like manner, band pass filter 522 also prevents low frequency energy from Pierce oscillator circuit 454 from reaching inverter 482. Therefore, Pierce oscillator 452 operates at a frequency between the frequencies of Pierce oscillator 450 and 454.

Resistors 504 and 506 and capacitors 510 and 512 form a band pass filter 524 in the input stage of Pierce oscillator circuit 454 preventing higher frequency energy from Pierce oscillator circuit 452 from reaching inverter 502 of Pierce oscillator circuit 454. In a like manner, band pass filter 524 also prevents low frequency energy from any additional Pierce oscillator circuits, as indicated by ellipses 526 and 528, from reaching inverter 502. Therefore, Pierce oscillator 454 operates at a frequency between the frequencies of Pierce oscillator 452 and any additional Pierce oscillators in the circuit.

As evident from consideration of FIG. 4b the invention can be expanded to allow more than three or more oscillators, assuming each resonator is quite different in frequency, approximately by a factor of 10, from any of the other resonators. In this way the invention saves N−1 pins, where N is the number of Pierce oscillators to be integrated.

In the previously described embodiments, crystals are depicted as the external resonators for the Pierce oscillator circuits. It can be readily understood that any resonator that is electrically stimulated may be used to effectuate an oscillator using the circuit. Such resonators include but are not limited to Micro-Electromechanical Systems (MEMS) resonators, etc.

Figure 5A:
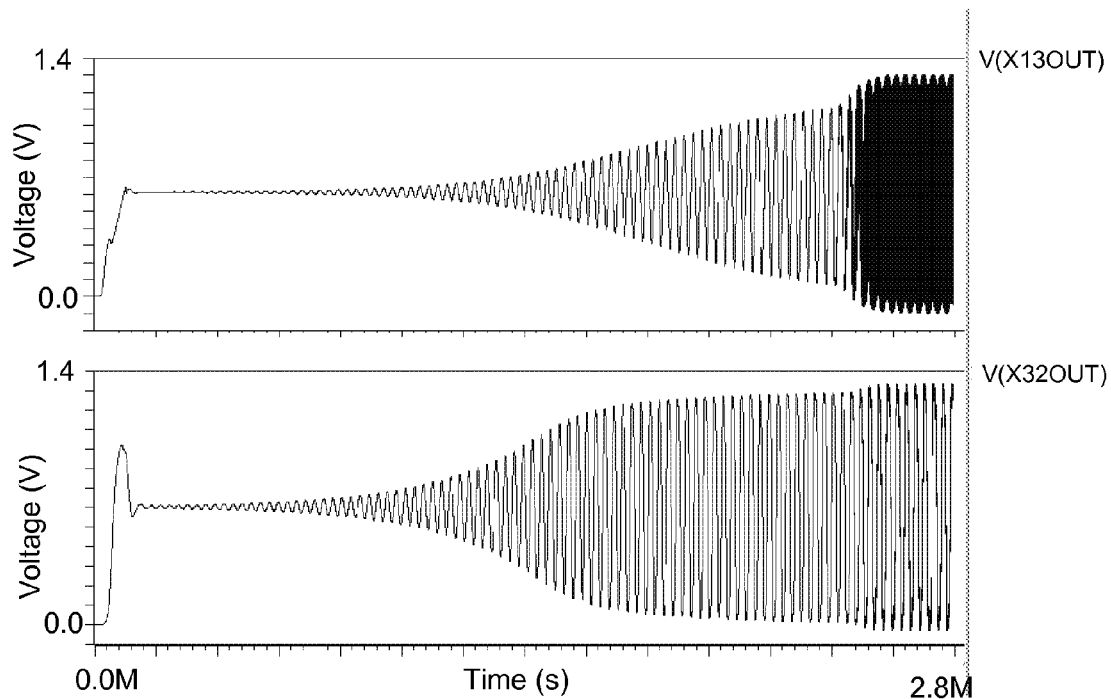
FIG. 5a is a graph illustrating operation of a dual Pierce oscillator on an integrated circuit chip having a shared pin in accordance with an exemplary embodiment of the present invention.
Figure 5B:
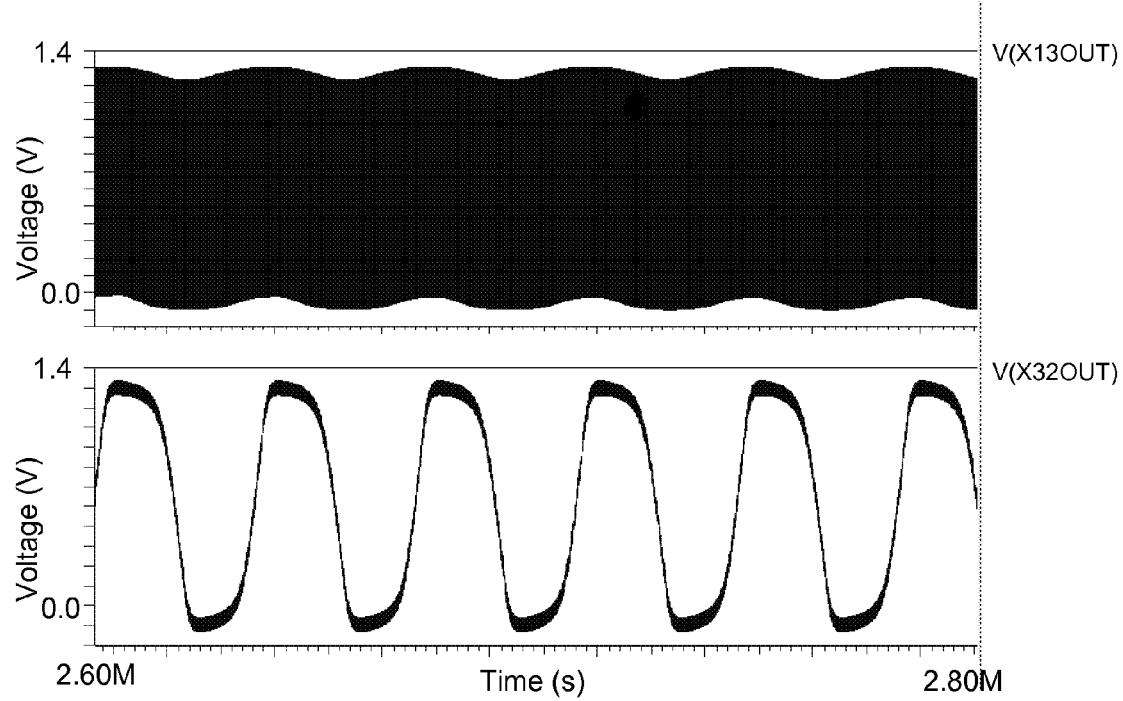
FIG. 5b is a graph illustrating operation of a dual Pierce oscillator on an integrated circuit chip having a shared pin in accordance with an exemplary embodiment of the present invention.

FIG. 5a is a graph illustrating simulated operation of a dual Pierce oscillator on an integrated circuit chip having a shared pin in accordance with an exemplary embodiment of the present invention. In FIG. 5 envelopes of the waveforms V(13out) and V(x32out) on capacitors 312 and 328 of FIG. 3 (the inputs to the filters 442 and 440 (of FIG. 4a), respectively, are shown. FIG. 5b is a close up of the waveform V(x32out) on 328 showing a primary waveform period of approximately $2^{-15}$ s, corresponding to 32768 Hz. FIG. 5b also shows waveform V(13out).

Figure 6A:
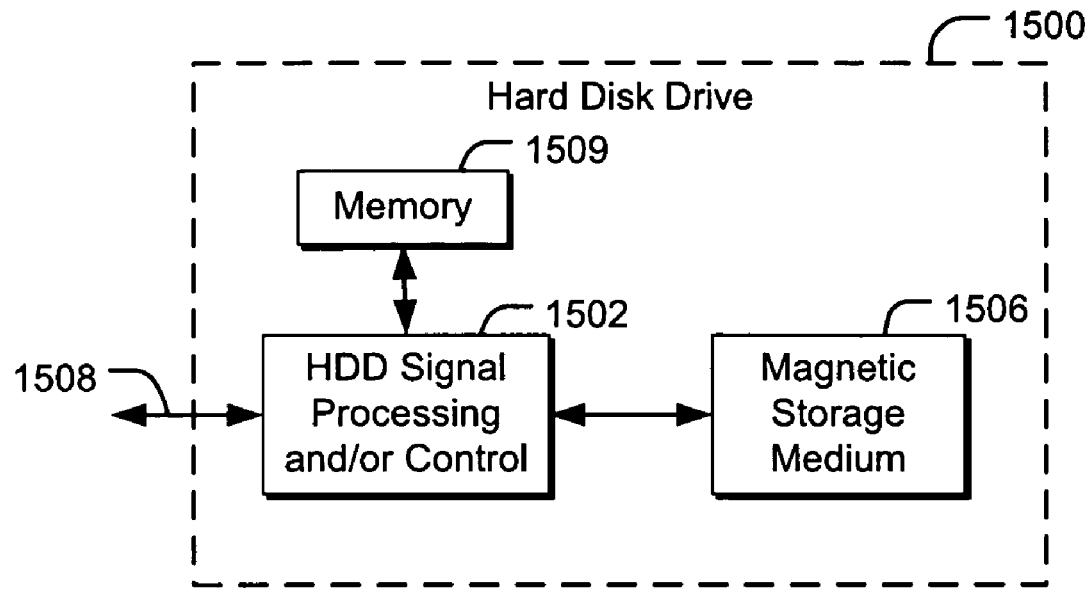
FIG. 6A is a block diagram showing an embodiment of the invention in a hard disk drive (HDD).

Referring now to FIGS. 6A-6H, various exemplary implementations of the present invention are shown. Referring to FIG. 6A, the present invention may be embodied in an integrated circuit chip used in a hard disk drive (HDD) 1500. The present invention may be implemented as part of either or both signal processing and/or control circuits, which are generally identified in FIG. 6A at 1502. In some implementations, signal processing and/or control circuit 1502 and/or other circuits (not shown) in HDD 1500 may process data, perform coding and/or encryption, perform calculations, and/or format data that is output to and/or received from a magnetic storage medium 1506.

HDD 1500 may communicate with a host device (not shown) such as a computer, mobile computing devices such as personal digital assistants, cellular phones, media or MP3 players and the like, and/or other devices via one or more wired or wireless communication links 1508. HDD 1500 may be connected to memory 1509, such as random access memory (RAM), a low latency nonvolatile memory such as flash memory, read only memory (ROM) and/or other suitable electronic data storage.

Figure 6B:
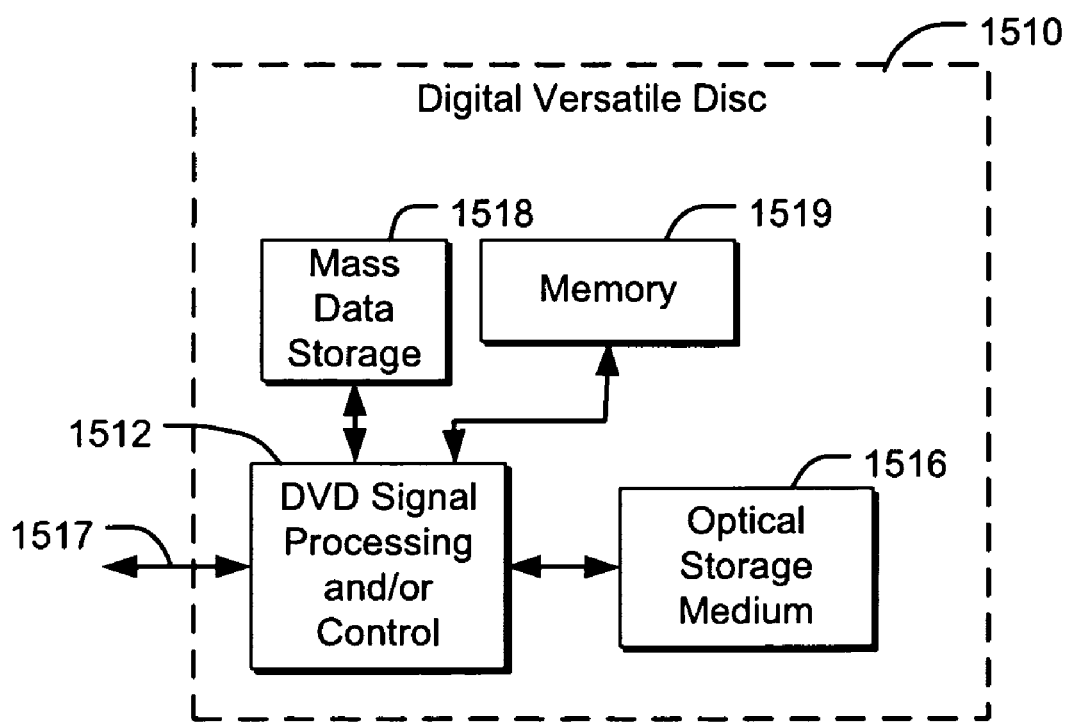
FIG. 6B is a block diagram of the invention in a digital versatile disc (DVD) drive.

Referring now to FIG. 6B, the present invention may be embodied in an integrated circuit chip used in a digital versatile disc (DVD) drive 1510. The present invention may be implemented as part of either or both signal processing and/or control circuits, which are generally identified in FIG. 6B at 1512, and/or mass data storage 1518 of DVD drive 1510. Signal processing and/or control circuit 1512 and/or other circuits (not shown) in DVD drive 1510 may process data, perform coding and/or encryption, perform calculations, and/or format data that is read from and/or data written to an optical storage medium 1516. In some implementations, signal processing and/or control circuit 1512 and/or other circuits (not shown) in DVD drive 1510 can also perform other functions such as encoding and/or decoding and/or any other signal processing functions associated with a DVD drive.

DVD drive 1510 may communicate with an output device (not shown) such as a computer, television or other device via one or more wired or wireless communication links 1517. DVD drive 1510 may communicate with mass data storage 1518 that stores data in a nonvolatile manner. Mass data storage 1518 may include a hard disk drive (HDD) such as that shown in FIG. 6A. The HDD may be a mini HDD that includes one or more platters having a diameter that is smaller than approximately 1.8". DVD drive 1510 may be connected to memory 1519, such as RAM, ROM, low latency nonvolatile memory such as flash memory, and/or other suitable electronic data storage.

Figure 6C:
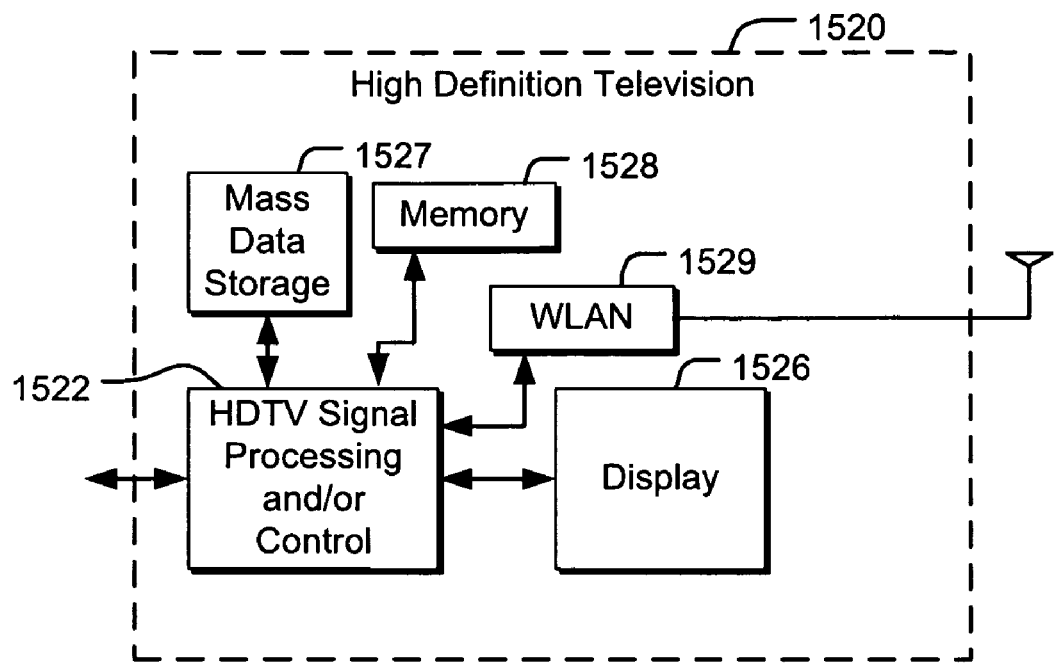
FIG. 6C is a block diagram of the invention in a high definition television (HDTV).

Referring now to FIG. 6C, the present invention may be embodied in an integrated circuit chip used in a high definition television (HDTV) 1520. The present invention may be implemented as part of either or both signal processing and/or control circuits, which are generally identified in FIG. 6C at 1522, a WLAN interface 1529 and/or mass data storage 1527 of the HDTV 1520. HDTV 1520 receives HDTV input signals in either a wired or wireless format and generates HDTV output signals for a display 1526. In some implementations, signal processing circuit and/or control circuit 1522 and/or other circuits (not shown) of HDTV 1520 may process data, perform coding and/or encryption, perform calculations, format data and/or perform any other type of HDTV processing that may be required.

HDTV 1520 may communicate with mass data storage 1527 that stores data in a nonvolatile manner such as optical and/or magnetic storage devices, for example, a hard disk drive or a DVD drive. At least one HDD may have the configuration shown in FIG. 6A and/or at least one DVD drive may have the configuration shown in FIG. 6B. The HDD may be a mini HDD that includes one or more platters having a diameter that is smaller than approximately 1.8". HDTV 1520 may be connected to memory 1528 such as RAM, ROM, low latency nonvolatile memory such as flash memory and/or other suitable electronic data storage. HDTV 1520 also may support connections with a WLAN via WLAN interface 1529.

Figure 6D:
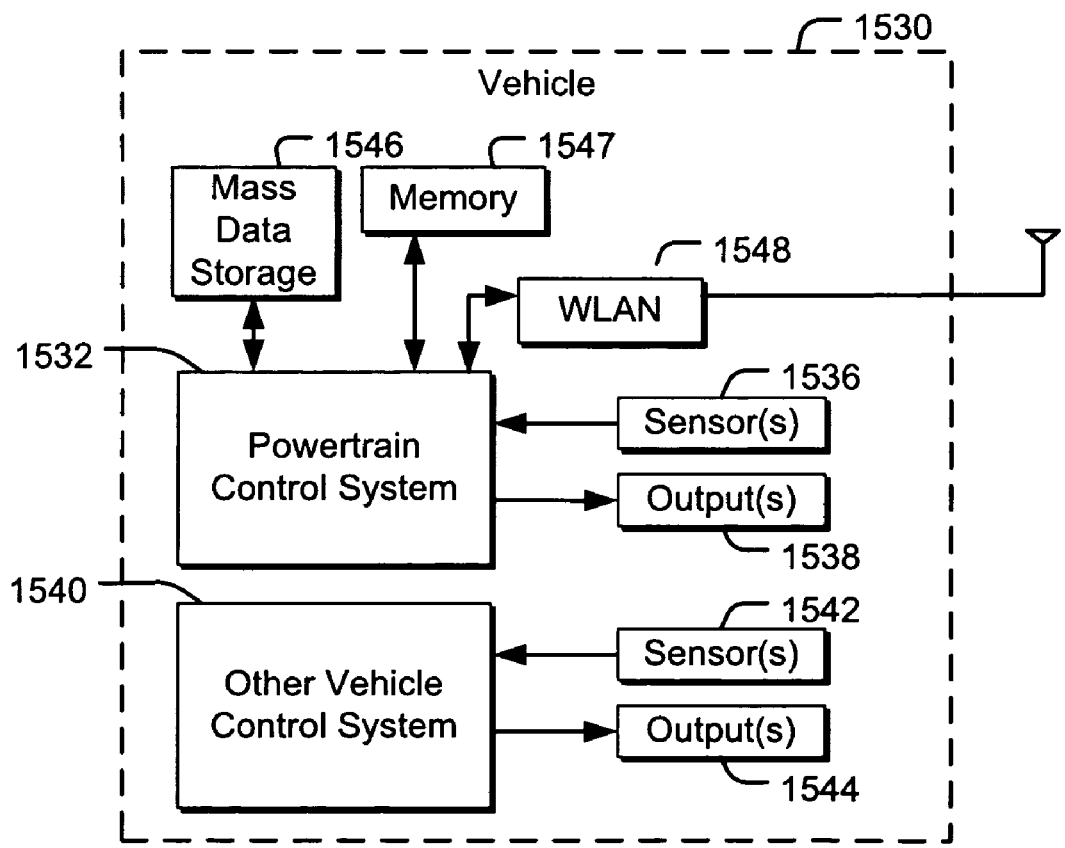
FIG. 6D is a block diagram of the invention in a vehicle.

Referring now to FIG. 6D, the present invention may be embodied in an integrated circuit chip used in a control system of a vehicle 1530, a WLAN interface 1548 and/or mass data storage 1546 of the vehicle 1530. In some implementations, the present invention is implemented as part of a powertrain control system 1532 that receives inputs from one or more sensors such as temperature sensors, pressure sensors, rotational sensors, airflow sensors and/or any other suitable sensors and/or that generates one or more output control signals such as engine operating parameters, transmission operating parameters, braking parameters, and/or other control signals.

The present invention may also be embodied in other control systems 1540 of vehicle 1530. Control system 1540 may likewise receive signals from input sensors 1542 and/or output control signals to one or more output devices 1544. In some implementations, control system 1540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1532 may communicate with mass data storage 1546 that stores data in a nonvolatile manner. Mass data storage 1546 may include optical and/or magnetic storage devices, for example, hard disk drives and/or DVD drives. At least one HDD may have the configuration shown in FIG. 6A and/or at least one DVD drive may have the configuration shown in FIG. 6B. The HDD may be a mini HDD that includes one or more platters having a diameter that is smaller than approximately 1.8". Powertrain control system 1532 may be connected to memory 1547 such as RAM, ROM, low latency nonvolatile memory such as flash memory and/or other suitable electronic data storage. Powertrain control system 1532 also may support connections with a WLAN via WLAN interface 1548. The control system 1540 may also include mass data storage, memory and/or a WLAN interface (all not shown).

Figure 6E:
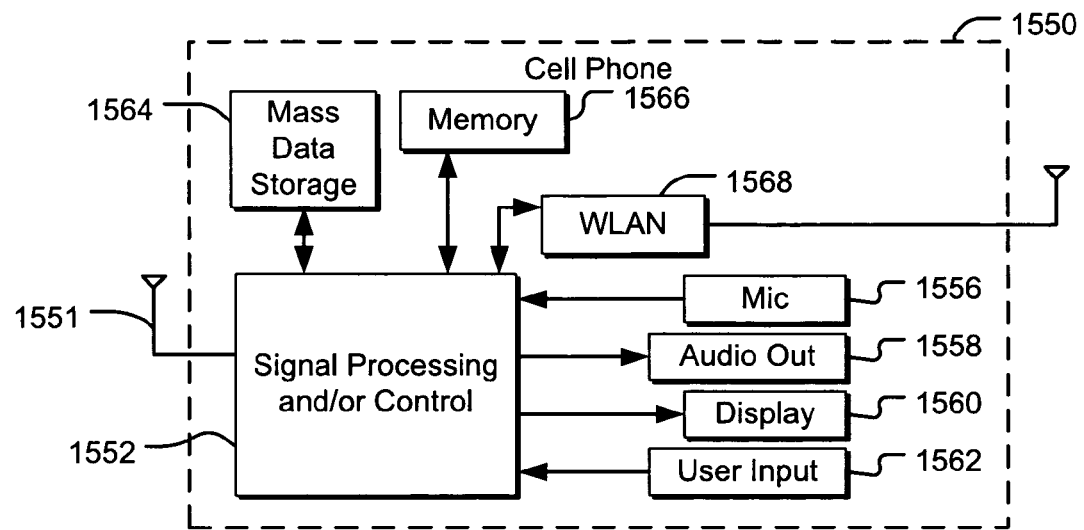
FIG. 6E is a block diagram of the invention in a cellular or mobile phone.

Referring now to FIG. 6E, the present invention may be embodied in an integrated circuit chip used in a cellular phone 1550 that may include a cellular antenna 1551. The present invention may be implemented as part of either or both signal processing and/or control circuits, which are generally identified in FIG. 6E at 1552, a WLAN interface 1568 and/or mass data storage 1564 of the cellular phone 1550. In some implementations, cellular phone 1550 includes a microphone 1556, an audio output 1558 such as a speaker and/or audio output jack, a display 1560 and/or an input device 1562 such as a keypad, pointing device, voice actuation and/or other input device. Signal processing and/or control circuits 1552 and/or other circuits (not shown) in cellular phone 1550 may process data, perform coding and/or encryption, perform calculations, format data and/or perform other cellular phone functions.

Cellular phone 1550 may communicate with mass data storage 1564 that stores data in a nonvolatile manner such as optical and/or magnetic storage devices, for example, hard disk drives and/or DVD drives. At least one HDD may have the configuration shown in FIG. 6A and/or at least one DVD drive may have the configuration shown in FIG. 6B. The HDD may be a mini HDD that includes one or more platters having a diameter that is smaller than approximately 1.8". Cellular phone 1550 may be connected to memory 1566 such as RAM, ROM, low latency nonvolatile memory such as flash memory and/or other suitable electronic data storage. Cellular phone 1550 also may support connections with a WLAN via WLAN interface 1568.

Figure 6F:
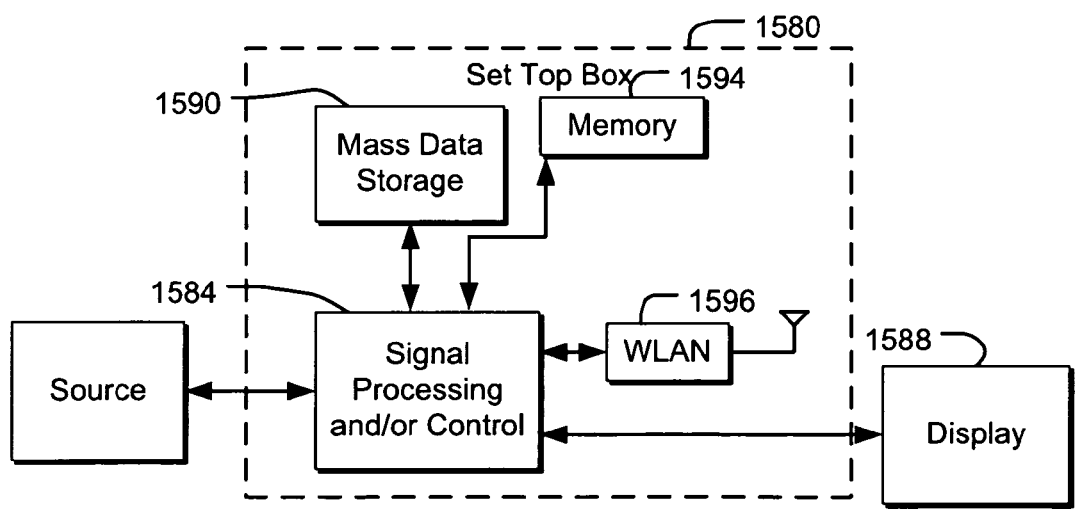
FIG. 6F is a block diagram of the invention in a set-top box.

Referring now to FIG. 6F, the present invention may be embodied in an integrated circuit chip used in a set top box 1580. The present invention may be implemented as part of either or both signal processing and/or control circuits, which are generally identified in FIG. 6F at 1584, a WLAN interface 1596 and/or mass data storage 1590 of the set top box 1580. Set top box 1580 receives signals from a source such as a broadband source and outputs standard and/or high definition audio/video signals suitable for a display 1588 such as a television and/or monitor and/or other video and/or audio output devices. Signal processing and/or control circuits 1584 and/or other circuits (not shown) of the set top box 1580 may process data, perform coding and/or encryption, perform calculations, format data and/or perform any other set top box function.

Set top box 1580 may communicate with mass data storage 1590 that stores data in a nonvolatile manner. Mass data storage 1590 may include optical and/or magnetic storage devices, for example, hard disk drives and/or DVD drives. At least one HDD may have the configuration shown in FIG. 6A and/or at least one DVD drive may have the configuration shown in FIG. 6B. The HDD may be a mini HDD that includes one or more platters having a diameter that is smaller than approximately 1.8". Set top box 1580 may be connected to memory 1594 such as RAM, ROM, low latency nonvolatile memory such as flash memory and/or other suitable electronic data storage. Set top box 1580 also may support connections with a WLAN via WLAN interface 1596.

Figure 6G:
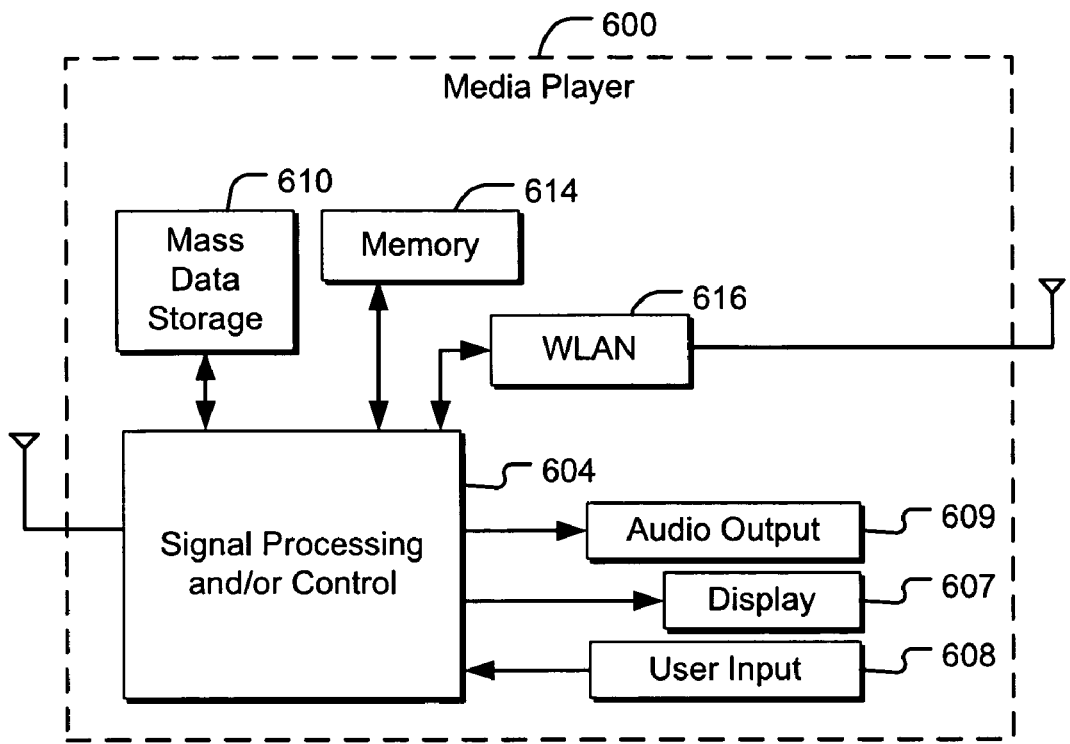
FIG. 6G is a block diagram of the invention in a media player.

Referring now to FIG. 6G, the present invention may be embodied in an integrated circuit chip used in a media player 600. The present invention may be implemented as part of either or both signal processing and/or control circuits, which are generally identified in FIG. 6G at 604, a WLAN interface 616 and/or mass data storage 610 of the media player 600. In some implementations, media player 600 includes a display 607 and/or a user input 608 such as a keypad, touchpad and the like. In some implementations, media player 600 may employ a graphical user interface (GUI) that typically employs menus, drop down menus, icons and/or a point-and-click interface via display 607 and/or user input 608. Media player 600 further includes an audio output 609 such as a speaker and/or audio output jack. Signal processing and/or control circuits 604 and/or other circuits (not shown) of media player 600 may process data, perform coding and/or encryption, perform calculations, format data and/or perform any other media player function.

Media player 600 may communicate with mass data storage 610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices, for example, hard disk drives and/or DVD drives. At least one HDD may have the configuration shown in FIG. 6A and/or at least one DVD drive may have the configuration shown in FIG. 6B. The HDD may be a mini HDD that includes one or more platters having a diameter that is smaller than approximately 1.8". Media player 600 may be connected to memory 614 such as RAM, ROM, low latency nonvolatile memory such as flash memory and/or other suitable electronic data storage. Media player 600 also may support connections with a WLAN via WLAN interface 616. Still other implementations in addition to those described above are contemplated.

Figure 6H:
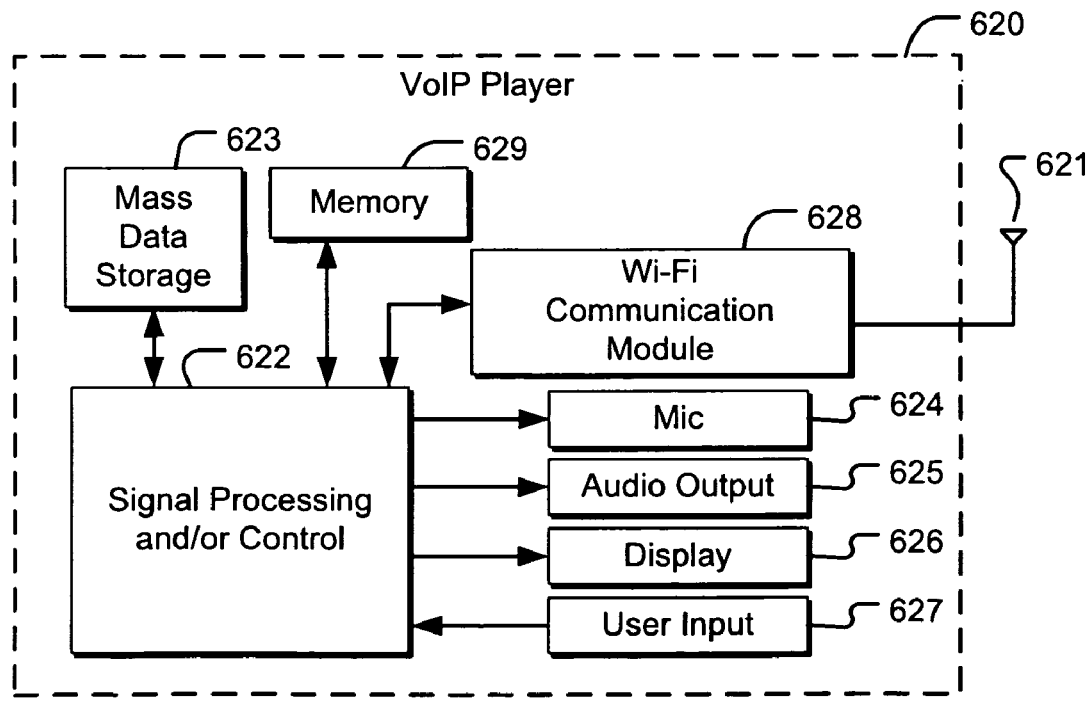
FIG. 6H is a block diagram of the invention in a Voice over Internet Protocol (VoIP) player.

Referring to FIG. 6H, the present invention may be embodied in an integrated circuit chip used in a Voice over Internet Protocol (VoIP) phone 620 that may include an antenna 621. The present invention may be implemented as part of either or both signal processing and/or control circuits, which are generally identified in FIG. 6H at 622, a wireless interface and/or mass data storage of the VoIP phone 620. In some implementations, VoIP phone 620 includes, in part, a microphone 624, an audio output 625 such as a speaker and/or audio output jack, a display monitor 626, an input device 627 such as a keypad, pointing device, voice actuation and/or other input devices, and a Wireless Fidelity (Wi-Fi) communication module 628. Signal processing and/or control circuits 622 and/or other circuits (not shown) in VoIP phone 620 may process data, perform coding and/or encryption, perform calculations, format data and/or perform other VoIP phone functions.

VoIP phone 620 may communicate with mass data storage 623 that stores data in a nonvolatile manner such as optical and/or magnetic storage devices, for example, hard disk drives and/or DVD drives. At least one HDD may have the configuration shown in FIG. 6A and/or at least one DVD drive may have the configuration shown in FIG. 6B. The HDD may be a mini HDD that includes one or more platters having a diameter that is smaller than approximately 1.8". VoIP phone 620 may be connected to memory 629, which may be a RAM, ROM, low latency nonvolatile memory such as flash memory and/or other suitable electronic data storage. VoIP phone 620 is configured to establish communications link with a VoIP network (not shown) via Wi-Fi communication module 628.

The invention has been described above with respect to particular illustrative embodiments. It is understood that the invention is not limited to the above-described embodiments and that various changes and modifications may be made by those skilled in the relevant art without departing from the scope of the invention.

What is claimed is:

1. A circuit comprising:
    a first oscillator circuit configured to operate at a first frequency, the first oscillator circuit including an input stage having a high-pass filter and a first circuit leg configured to couple an output stage of the first oscillator circuit to a first external resonator resonant at the first frequency;
    a second oscillator circuit configured to operate at a second frequency different than the first frequency, the second oscillator circuit including an input stage having a low-pass filter and a second circuit leg configured to couple an output stage of the second oscillator circuit to a second external resonator resonant at the second frequency; and
    a third circuit leg shared between the first oscillator circuit and the second oscillator circuit, the third circuit leg configured to couple a first input stage of the first oscillator circuit to the first external resonator and couple the second input stage of the second oscillator circuit to the second external resonator.

2. The circuit of claim 1, wherein the first resonator comprises a MEMS resonator.

3. The circuit of claim 1, wherein the second resonator comprises a MEMS resonator.

4. The circuit of claim 1, wherein the first resonator comprises a crystal resonator.

5. The circuit of claim 1, wherein the second resonator comprises a crystal resonator.

6. The circuit of claim 1, wherein:
    the circuit is implemented in an integrated circuit chip; and
    the third circuit leg is coupled to a pin of the integrated circuit chip, the pin being shared by the first oscillator circuit and the second oscillator circuit.

7. The circuit of claim 1, wherein the first frequency is approximately 10 times the second frequency.

8. The circuit of claim 1, wherein the first frequency is greater than or equal to 10 times the second frequency.

9. The circuit of claim 1, wherein the second frequency is lower than the first frequency.

10. The circuit of claim 9, further comprising:
    a plurality of oscillator circuits, each oscillator circuit configured to operate at a respective one of a plurality of unique frequencies with each unique frequency being lower than the first frequency and higher than the second frequency, each of the plurality of oscillator circuits including a respective input stage having a band-pass filter operable at a respective one of the plurality of unique frequencies, and a respective circuit leg configured to couple a respective output stage of the each oscillator circuit to a respective one of a plurality of external resonators resonant at a respective one of the unique frequencies wherein the third circuit leg couples the respective input stage of the each of the plurality of oscillator circuits to respective one of the plurality of external resonators.

11. The circuit of claim 10, wherein at least one of the plurality of external resonators comprises a MEMS resonator.

12. The circuit of claim 10, wherein at least one of the plurality of external resonators comprises a crystal resonator.

13. The circuit of claim 10, wherein:
    the circuit is implemented in an integrated circuit chip; and
    the third circuit leg is coupled to a pin of the integrated circuit chip, the pin being shared by the plurality of oscillator circuits, the first oscillator circuit and the second oscillator circuit.

14. The circuit of claim 1, wherein the circuit is implemented in a device.

15. The circuit of claim 14, wherein the device comprises one of a hard disk drive, digital versatile disc drive, high definition television, vehicle, cellular phone, set top box, media player, or Voice over Internet Protocol player.

* * * * *